(12) United States Patent
Wu et al.

(10) Patent No.: US 12,402,266 B2
(45) Date of Patent: Aug. 26, 2025

(54) COMPUTING DEVICE RACK AND RETAINING SYSTEM

(71) Applicant: Lenovo Enterprise Solutions (Singapore) Pte. Ltd., New Tech Park (SG)

(72) Inventors: Yi Lung Wu, New Taipei (TW); Hung-Jen Chen, Taoyuan (TW); Shihying Huang, Taoyuan (TW)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 17/530,758

(22) Filed: Nov. 19, 2021

(65) Prior Publication Data

US 2022/0167520 A1    May 26, 2022

(30) Foreign Application Priority Data

Nov. 20, 2020  (CN) .......................... 202011307525.1

(51) Int. Cl.
*H05K 7/14*    (2006.01)
*H05K 5/02*    (2006.01)

(52) U.S. Cl.
CPC ......... *H05K 7/1402* (2013.01); *H05K 5/0221* (2013.01); *H05K 7/1489* (2013.01)

(58) Field of Classification Search
None
See application file for complete search history.

(56) References Cited

U.S. PATENT DOCUMENTS

| | | | | |
|---|---|---|---|---|
| 5,481,431 | A * | 1/1996 | Siahpolo | G06F 1/187 |
| 7,771,218 | B2 * | 8/2010 | Jaramillo | H05K 7/1492 |
| | | | | 439/157 |
| 8,369,080 | B2 * | 2/2013 | Huang | G06F 1/187 |
| | | | | 361/679.37 |
| 9,052,878 | B2 * | 6/2015 | Lo | G11B 33/022 |
| 9,134,772 | B2 * | 9/2015 | Zhang | G06F 1/187 |
| 9,389,651 | B2 * | 7/2016 | Brockett | G06F 1/187 |
| 9,454,192 | B2 * | 9/2016 | Farrow | G06F 1/187 |
| 9,607,660 | B2 * | 3/2017 | Bennett, II | G11B 3/124 |
| 9,655,269 | B2 * | 5/2017 | Paykarimah | H05K 7/1418 |
| 9,658,658 | B2 * | 5/2017 | Yu | G06F 1/181 |
| 9,717,158 | B2 * | 7/2017 | Della Fiora | G11B 33/022 |
| 9,986,657 | B2 * | 5/2018 | Yang | H05K 7/14 |
| 10,165,696 | B1 * | 12/2018 | Blasingame | H05K 5/0221 |
| 10,180,707 | B2 * | 1/2019 | Farrow | G06F 1/187 |
| 10,251,300 | B1 * | 4/2019 | Mao | H05K 7/1487 |
| 10,433,451 | B1 * | 10/2019 | Wang | H05K 7/1417 |
| 10,832,101 | B2 * | 11/2020 | Ho | H01R 12/7005 |

(Continued)

Primary Examiner — Xanthia C Cunningham
(74) Attorney, Agent, or Firm — Kunzler Bean & Adamson (57) ABSTRACT

A computing device rack for housing a computing device. The rack comprises a frame to which a computing device is mountable, a retaining member mounted to the frame, and the retaining member having a latch that is movable relative to the frame, and an actuator movably coupled to the frame and the retaining member. Movement of the actuator relative to the frame and the retaining member from a first position to a second position deforms the retaining member to move the latch from an initial position to a final position relative to the frame, and thereby engages or disengages with the computing device that is mounted on the frame for locking or unlocking, respectively.

18 Claims, 12 Drawing Sheets

(56) References Cited

U.S. PATENT DOCUMENTS

| | | | | |
|---|---|---|---|---|
| 11,169,581 | B1* | 11/2021 | Lewis | H05K 5/0226 |
| 11,439,033 | B2* | 9/2022 | Mao | H05K 7/1457 |
| 2010/0208423 | A1* | 8/2010 | Lai | G06F 1/187 |
| | | | | 361/679.38 |
| 2011/0299237 | A1* | 12/2011 | Liang | G11B 33/128 |
| | | | | 361/679.38 |
| 2013/0250506 | A1* | 9/2013 | Fujiwara | H05K 7/14 |
| | | | | 361/679.01 |
| 2014/0118908 | A1* | 5/2014 | Gregg | G06F 1/1601 |
| | | | | 361/679.01 |
| 2015/0062801 | A1* | 3/2015 | Zhang | A47B 46/00 |
| | | | | 211/26.2 |
| 2015/0085451 | A1* | 3/2015 | Yu | G06F 1/185 |
| | | | | 361/747 |
| 2017/0196107 | A1* | 7/2017 | Chen | F16M 13/022 |
| 2017/0332512 | A1* | 11/2017 | Potter | G06F 1/16 |
| 2018/0157295 | A1* | 6/2018 | Zhu | H05K 5/023 |

* cited by examiner

COMPUTING DEVICE RACK AND RETAINING SYSTEM

TECHNICAL FIELD

Disclosed herein relates to a computing device rack and a retaining system and in particular to a server rack and a computing system having server nodes mounted to a rack.

BACKGROUND

Computing devices such as server nodes are mounted and secured to a server rack under a typical computer data room arrangement. To ensure proper position and connection of server nodes in a rack, there is a requirement to lock each server node to the rack during normal operation of the server nodes, and unlock and remove a server node from the server rack for maintenance and/or replacement. To optimize the available room space while reserving sufficient clearance surrounding the rack for maintenance, it is desirable to provide a computing system and a retaining apparatus capable of reliably locking each server node to a rack, and conveniently unlock a server node from the rack in case of need for maintenance.

SUMMARY

In one aspect, the present disclosure provides a computing device rack for housing a computing device. The rack comprises a frame to which a computing device is mountable, a retaining member mounted to the frame, the retaining member having a latch that is movable relative to the frame, and an actuator movably coupled to the frame and the retaining member. Movement of the actuator relative to the frame and the retaining member from a first position to a second position deforms the retaining member to move the latch from an initial position to a final position relative to the frame, and thereby engages or disengages with the computing device that is mounted on the frame for locking or unlocking, respectively.

In another aspect, the present disclosure provides a computing system. The computing system comprises a frame, a computing device detachably coupled to the frame, a retaining member mounted to the frame, the retaining member having a latch that is movable relative to the frame; and an actuator moveably coupled to the frame and the retaining member. Movement of the actuator from a first position to a second position deforms the retaining member to move the latch relative to the support portion from an initial position to a final position relative to the frame, and thereby engages or disengages with the computing device that is mounted on the frame for locking or unlocking, respectively.

BRIEF DESCRIPTION OF DRAWINGS

The features of the embodiments will be more comprehensively understood in conjunction with the accompanying drawings, in which.

DETAILED DESCRIPTION

Illustrated in FIGS. 1 to 11 is a computing system, such as a computer server system 50 and a computing device rack 100 according to one embodiment of the present disclosure. As shown in FIGS. 1 to 7, the computer server system 50 includes a rack 100 and one or more servers 80 removably coupled to the rack 100. The rack 100 comprises a frame 110 with one or more compartments 120 formed therein. A pair of sidewalls 122 and 124, a top plate 121 and a bottom plate 125 of the frame 110 enclose an internal space to form the compartment 120. Each compartment 120 is to receive and retain a server 80 therein. A retaining member 130 and an actuator 140 are mounted to an external side of on one of the sidewalls, e.g. sidewall 122. Server 80 is removable from the compartment 120 for maintenance and/or replacement, and inserted into the compartment 120 to perform normal computer operation after completion of maintenance and/or replacement.

The retaining member 130 has a support portion 132, a latch 138 movably coupled to the frame 110, and a link portion 134 between the support portion 132 and the latch 138.

The support portion 132 is mounted to the frame 110 by e.g. a fastener or by welding. Alternatively, the retaining member 130 may be integrally formed with the frame 110 by e.g. stamping from a single piece of metal plate. The latch 138 is fixedly coupled to or formed integral with the support portion 132 through the link portion 134. The retaining member 130 is made of resilient material e.g. steel or alloy with predetermined elastically deformable properties. The link portion 134 is therefore elastically deformable following which the latch 138 is movable relative to the support portion 132 and the sidewall 122.

The sidewall 122 has an opening 128 formed thereon. The latch 138 is positioned to be in alignment with the opening 128, and is movable relative to the frame 110 between an initial position 138a and a final (deflected) position 138b. At the initial position, the latch 138 is placed to pass through the opening 128 and extended into the compartment 120. At the final position 138b, the latch 138 is moved out of the compartment 120 through the opening 128.

Figure 1:
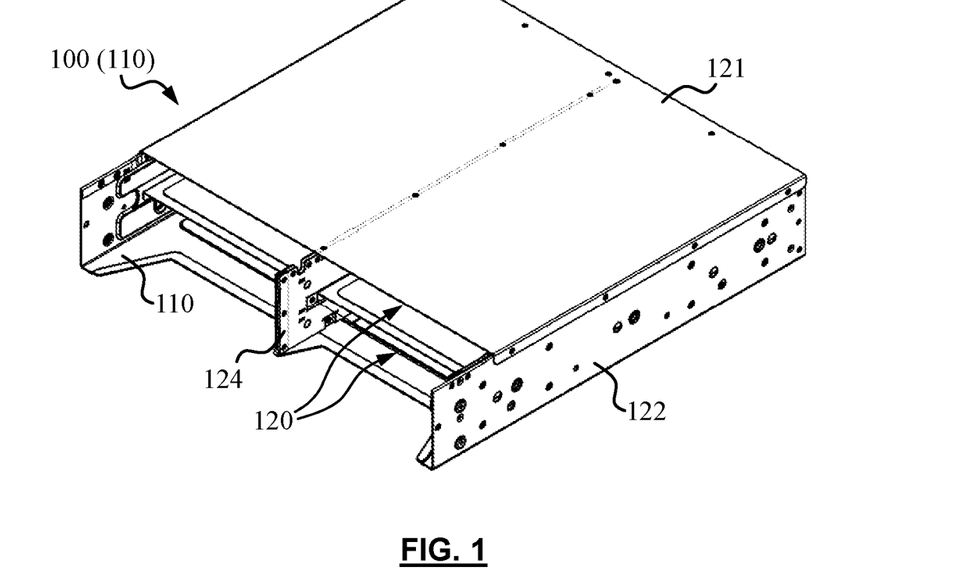
FIG. 1 is a perspective view of a computing device rack according to one embodiment.
Figure 2:
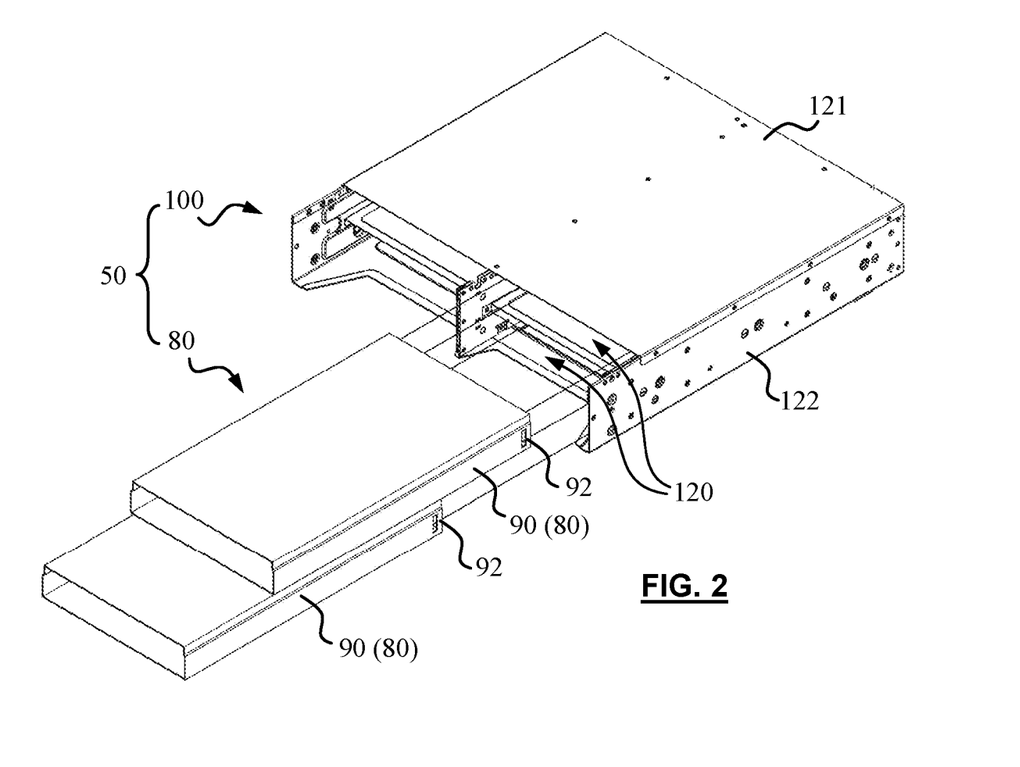
FIG. 2 is a perspective view of a computer server system with one or more servers for mounting to a rack shown in FIG. 1.
Figure 3:
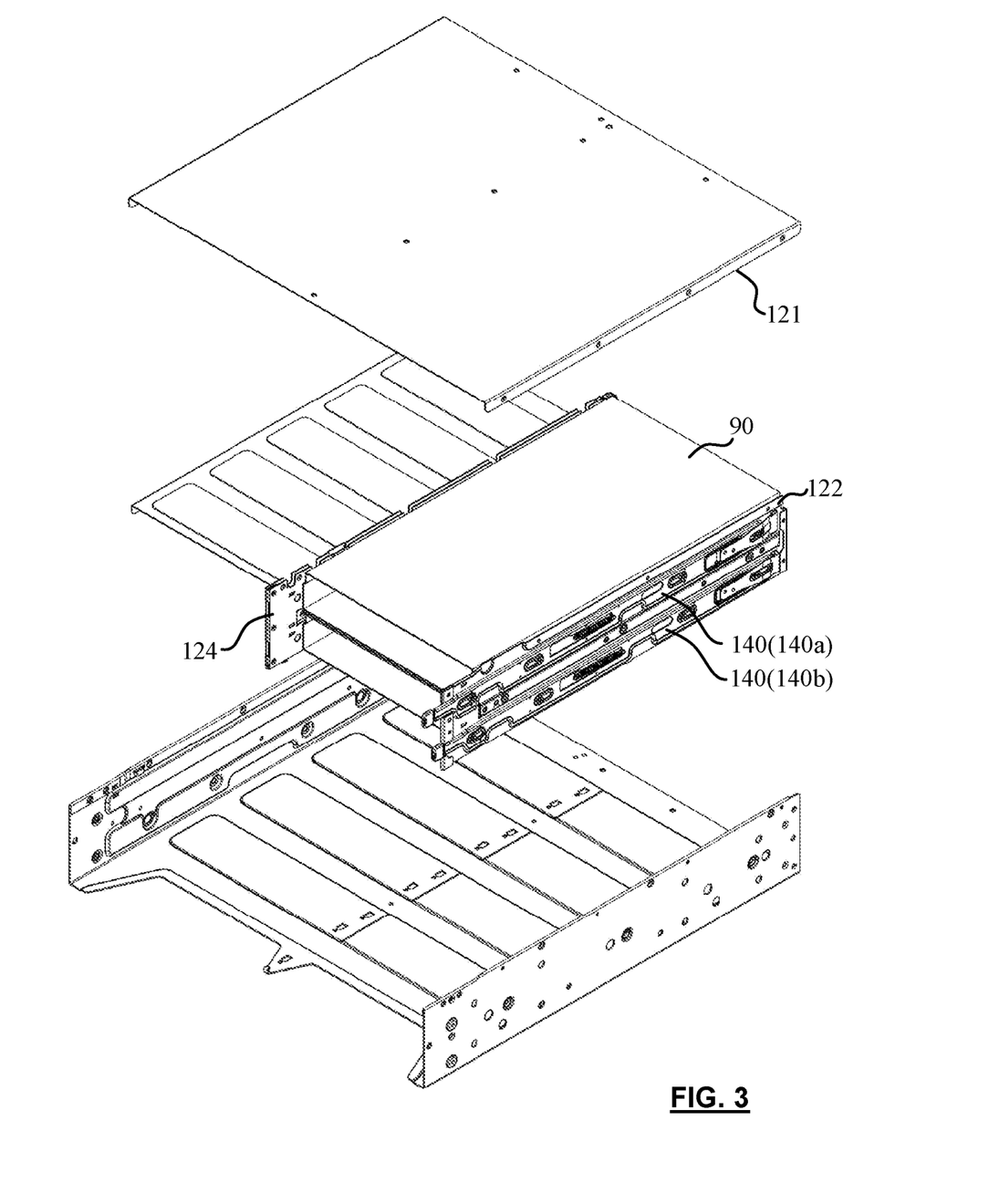
FIG. 3 is an exploded view of FIG. 1.
Figure 4:
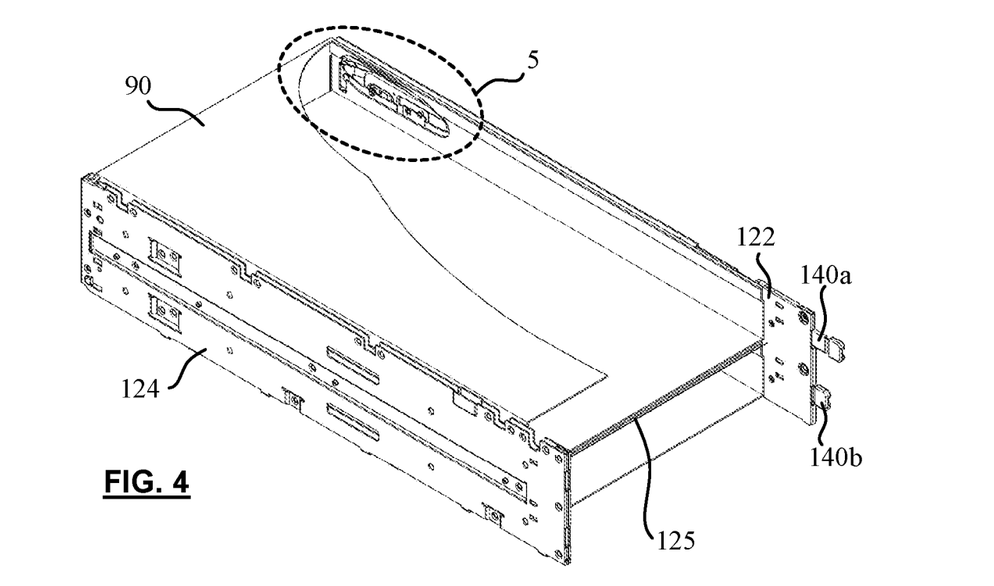
FIG. 4 is a partial cross sectional view an example rack of FIG. 1.
Figure 5:
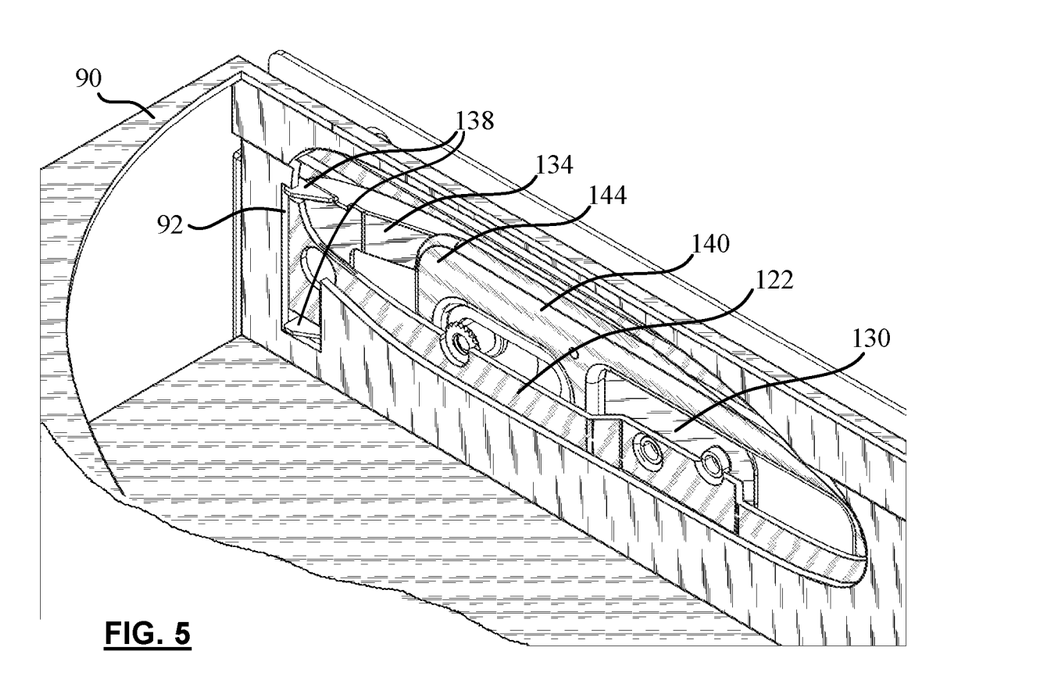
FIG. 5 is a partial enlarged view of portion 5 of FIG. 4.
Figure 6:
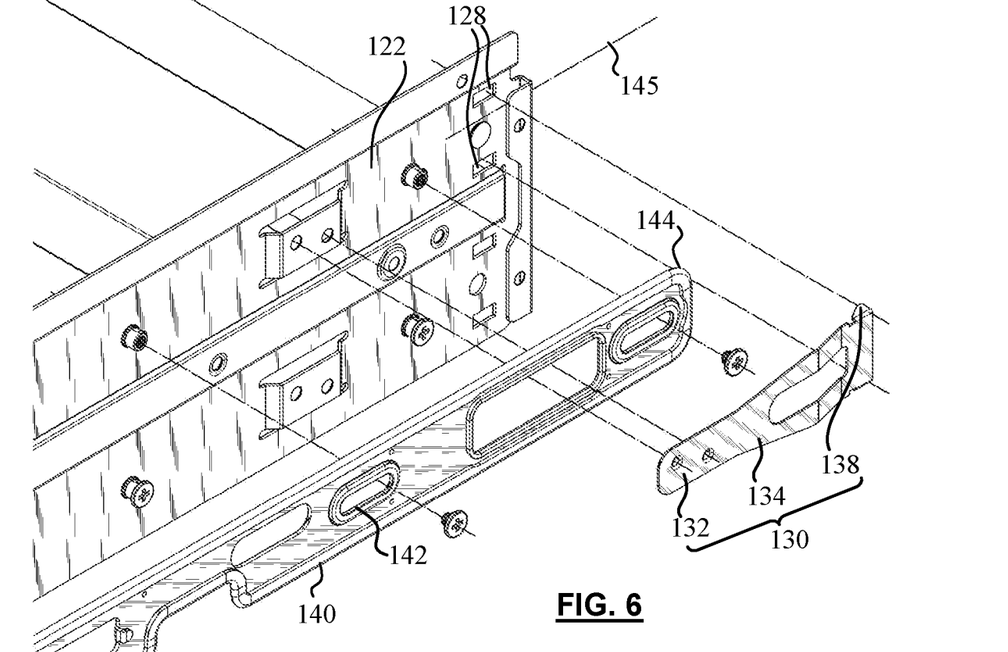
FIG. 6 is a partial exploded view of FIG. 3 showing an assembly of the retaining member and the actuator.
Figure 7:
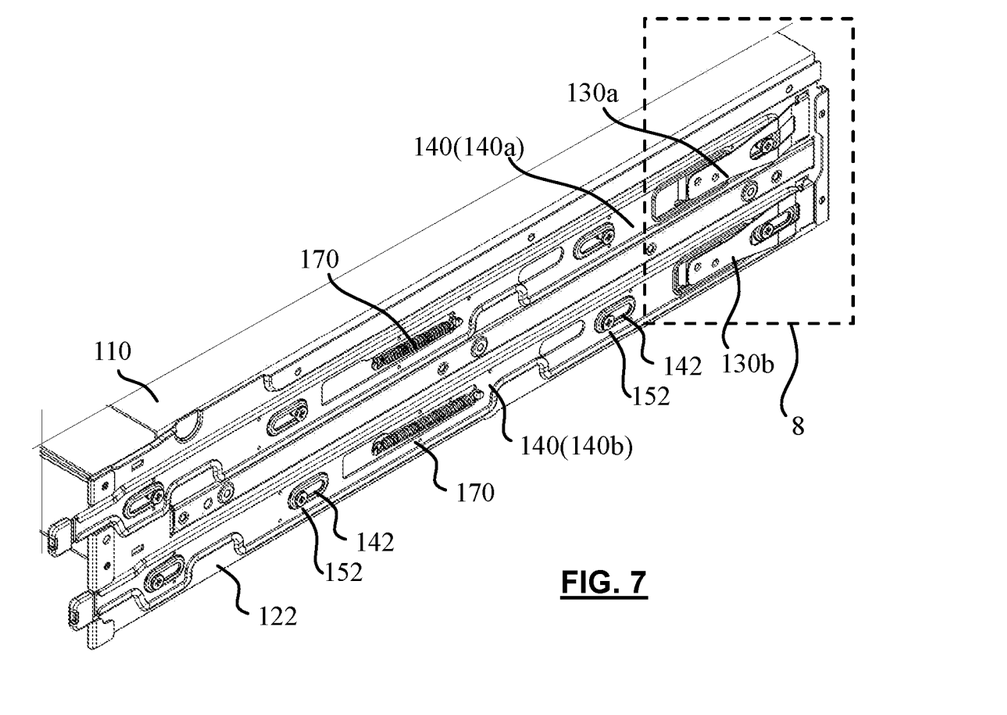
FIG. 7 is an enlarged partial view of FIG. 3 showing the actuator in two positions.
Figure 8:
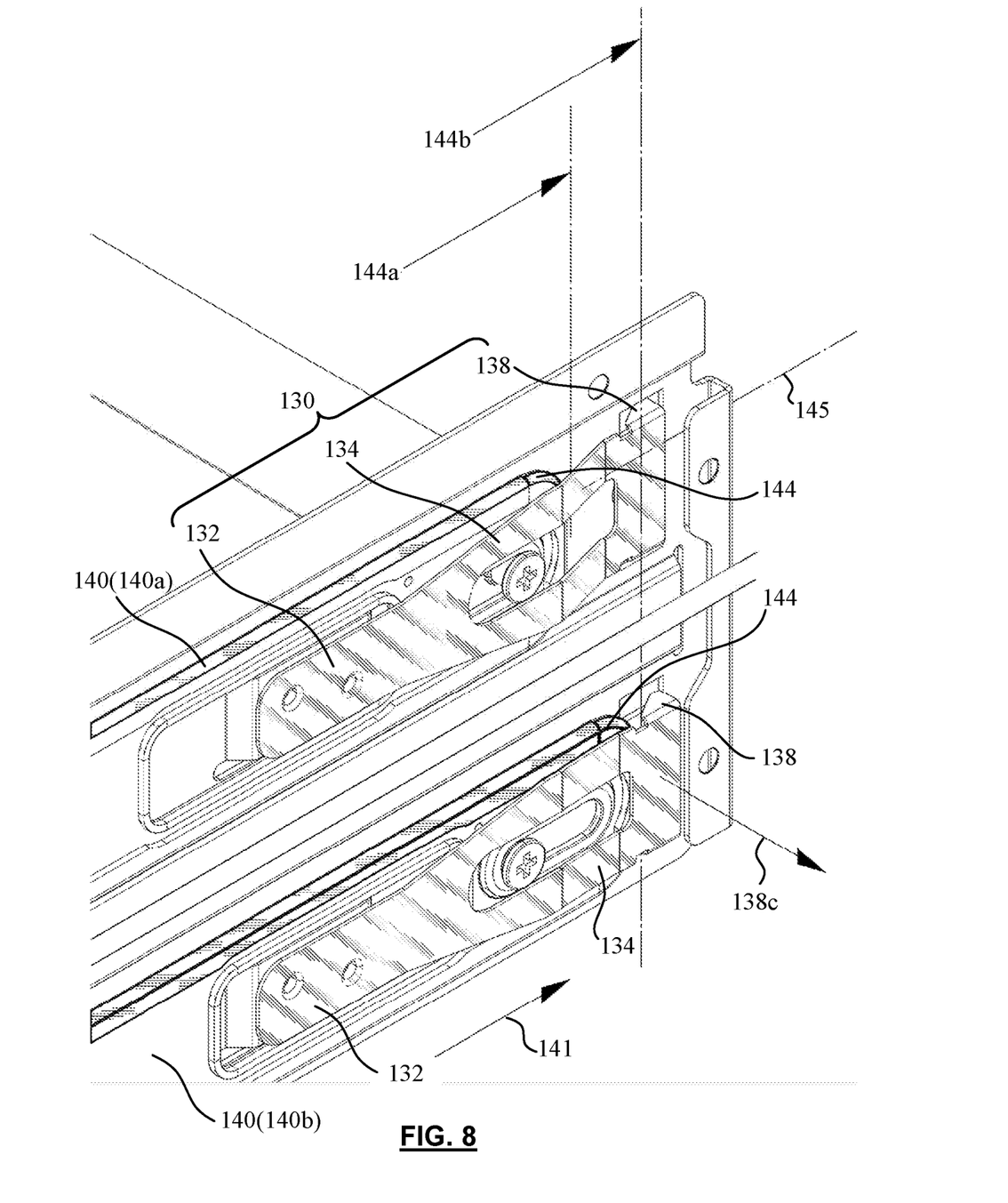
FIG. 8 is a partial enlarged view of portion 8 of FIG. 7.

As shown in FIGS. 6 and 7, the actuator 140 is movably coupled to the frame 110 and the retaining member 130. The actuator 140 is slidably coupled to the sidewall 122, by mounting screws or rivets 152 passing through elongated holes 142 formed on the actuator 140. The actuator 140 has an executing portion 144 positioned between the sidewall 122 and the retaining member 130. The actuator 140 is movable relative to the sidewall 122, between a first position 144a and a second position 144b, along a movement or actuating path 145 intersecting the link portion 134 of the retaining member 130.

As shown in FIGS. 8, 9, 10 and 11 with further details, the actuator 140 at the first position 144a is depicted by reference number 140a and the actuator 140 at the second position 144b is depicted by reference number 140b, i.e. the actuator 140a, 140b shown in each of FIGS. 8, 9, 10 and 11 refer to the same actuator 140 as shown in FIGS. 1 to 7, and at respective first position 144a and second position 144b. Upon the actuator 140a being at the first position 144a, there is left a space 135 between the link portion 134 and the sidewall 122. Due to the resiliency of the retaining member 130, the link portion 134 is biased to occupy the space 135 and the latch 138 is biased by the link portion 134 to extend into the compartment 120 through the opening 128 of the sidewall 122.

Figure 9:
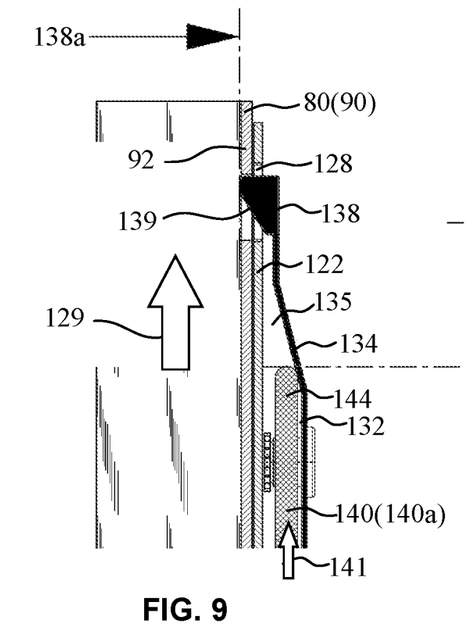
FIG. 9 is an enlarged top view of FIG. 8 showing the actuator at the first position.

At the initial position 138a, the latch 138 extends into the compartment 120 and engages a chassis 90 of a server 80, to prevent the sever 80 from being removed from the compartment 120 and accordingly, the server 80 is secured in the compartment 120 by the latch 138.

In cases where the server 80 is to be removed from the compartment 120 for e.g. for maintenance, the actuator 140 is operated to move from the first position 144a toward the second position 144b, along the pushing direction 141. Movement of the actuator 140 toward the second position 144b engages the link portion 134 of the retaining member 130 and therefore deflects the link portion 134 by overcoming the resilient force of the retaining member 130. Following the deflection of the link portion 134, the latch 138 is moved from the initial position 138a inside the compartment 120, as shown in e.g. FIG. 9, to a final position 138b outside the compartment 120, as shown in e.g. FIG. 10, i.e. the latch 138 is retracted from the compartment 120 through the opening 128.

Figure 10:
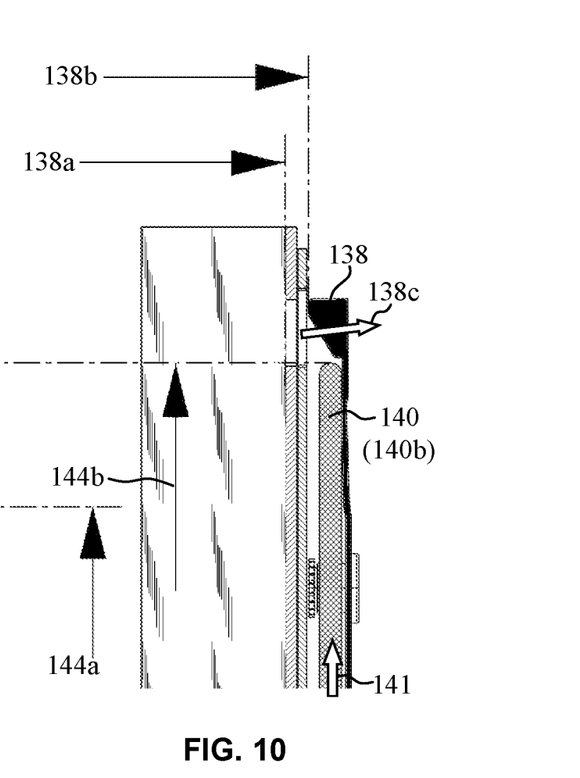
FIG. 10 is an enlarged top view of FIG. 8 showing the actuator at the second position.
Figure 11:
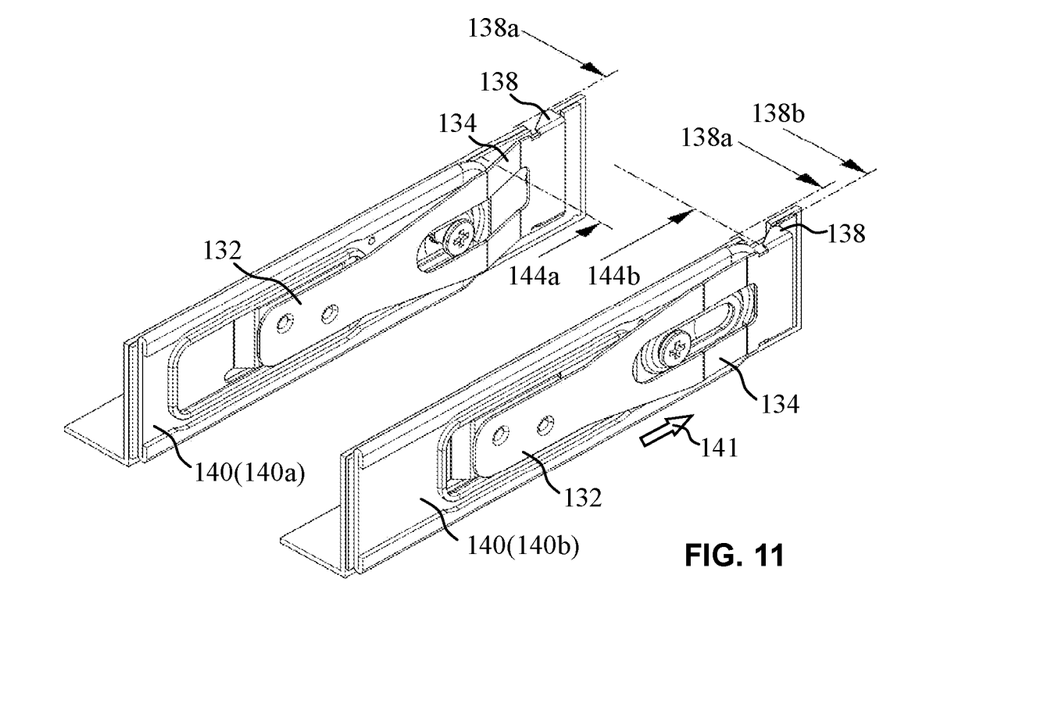
FIG. 11 is a perspective view showing the actuator in two positions compared in a side-by-side view.
Figure 12:
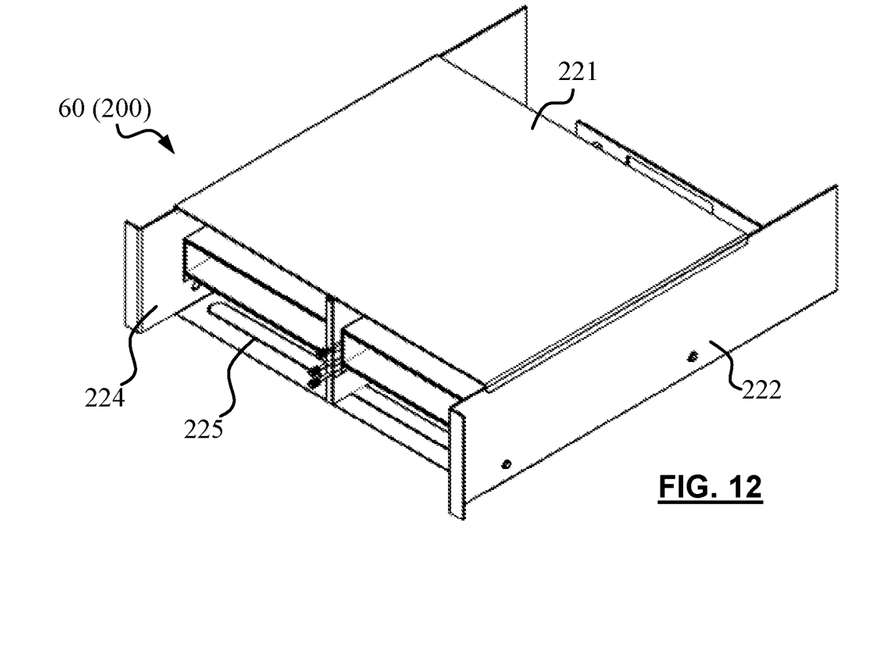
FIG. 12 is a perspective view of a computing device rack according to another embodiment.
Figure 13:
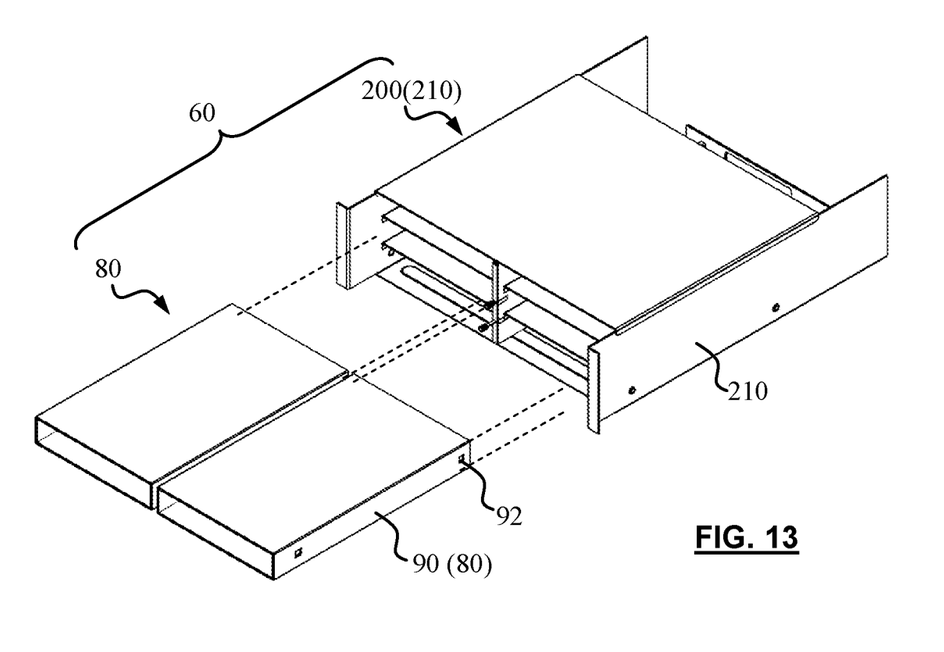
FIG. 13 is a perspective view of a computer server system with one or more servers for mounting to a rack shown in FIG. 12.
Figure 14:
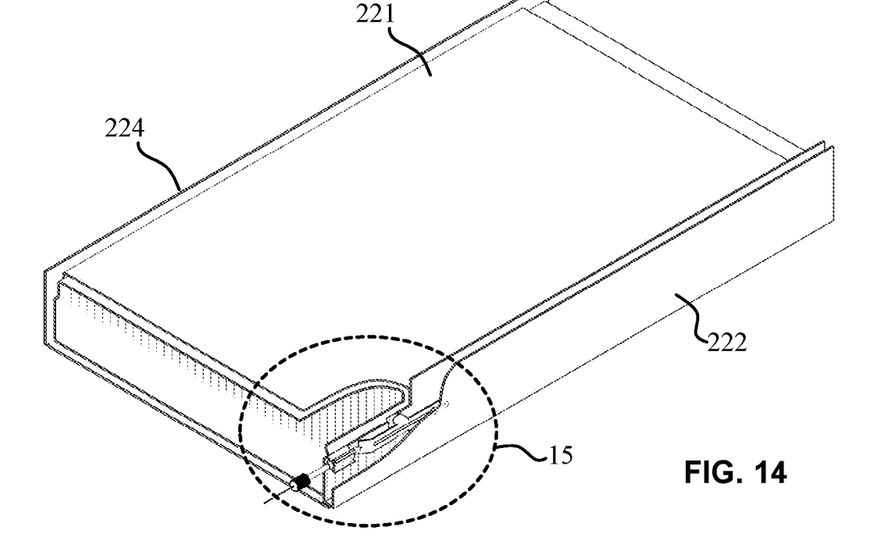
FIG. 14 is a partial exploded view of one example rack of FIG. 12.
Figure 15:
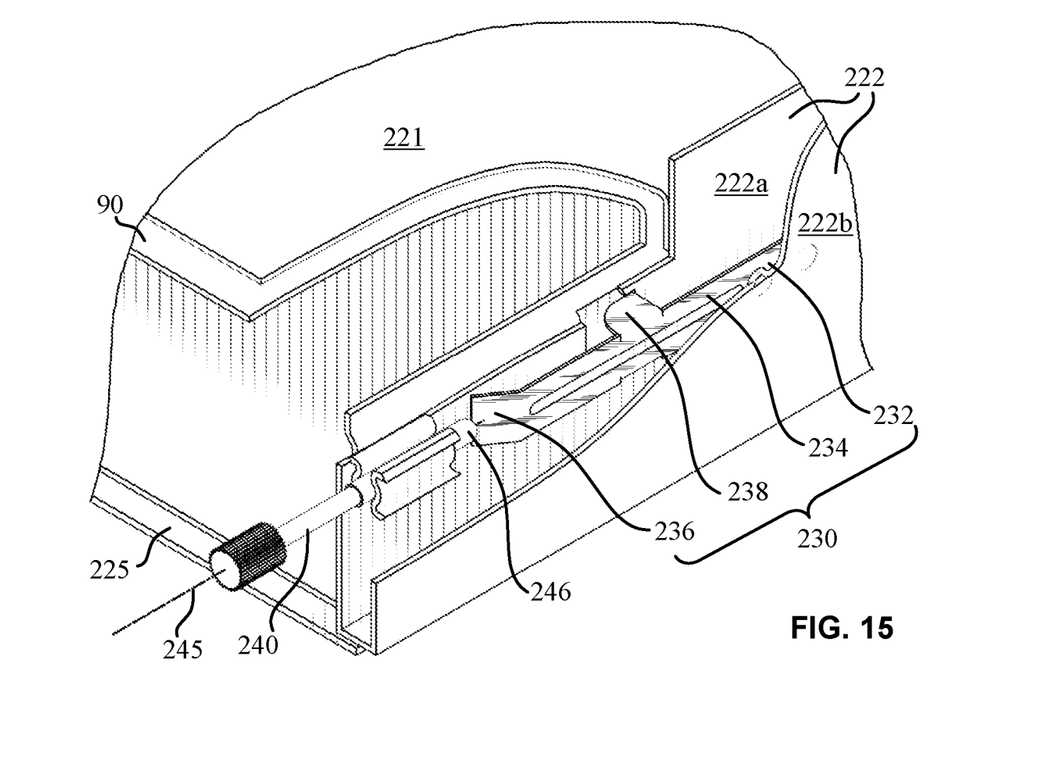
FIG. 15 is an enlarged partial view of FIG. 14.

Upon the latch 138 being retracted from the compartment 120, the server chassis 90 becomes disengaged from the latch 138 to unlock the server 80 such that the server 80 may be removed from the frame 110 for the purpose of maintenance and/or replacement.

Upon completion of maintenance, the server 80 can be inserted into the compartment 120 to resume operation. The actuator 140 is moved from the second position 144b back to the first position 144a to vacate the space 135. Due to the resiliency of the retaining member 130, the biasing force of the retaining member 130 causes the link portion 134 to spring back to occupy the space 135 and to return the latch 138 to the initial position 138a i.e. the latch 138 extends into the compartment 120 through the opening 128 and engages the chassis 90 to lock the server 80 in the compartment 120 of the frame 110.

The latch 138 may have a slanted edge 139 (FIG. 9) facing an insertion direction 129 of the compartment 120. In the process of the server 80 being inserted into the compartment 120, the chassis 90 engages the slanted edge 139 to push the latch 138 out of the compartment 120. After the stopper 92 of the chassis 90 passes over the latch 138, the engagement between the chassis 90 and the slanted edge 139 is released to allow the latch 138 to spring back and placed in the compartment 120 to lock the server 80 to the frame 110.

In this regard, the latch 138 may be allowed to resume to the initial position 138a while the compartment 120 is vacant, such that the compartment 120 is ready for receiving the server 80 and locking the server 80 in the compartment 120.

As the executing portion 144 is positioned between the sidewall 122 and the link portion 134 and biased by the link portion 134, the actuator 140 is self-lockable to the frame 110 by the friction between the actuator 140 and the sidewall 122 and the friction between the actuator 140 and the retaining member 130.

Alternatively or additionally, as shown in FIG. 7, the rack 100 may further include a resilient member e.g. a helical spring 170 coupled between the frame 110 and the actuator 140 to urge the actuator 140 toward the first position 140a. The helical spring 170 exerts a force on the actuator 140 to pull the actuator 140 back to the first position 144a after an external force pushing the actuator 140 toward the second position 144b is removed by e.g. a user releasing the actuator 140, the server 80 is removed from the compartment 120.

FIGS. 12 to 18 illustrate a computing system 60 according to another embodiment of the present disclosure. The computing system 60 includes a rack 200 and one or more servers 80 removably coupled to the rack 200. The rack 200 comprises a frame 210 with one or more compartments 220 formed therein. A pair of sidewalls 222 and 224, a top plate 221 and a bottom plate 225 of the frame 210 enclose an internal space to form the compartment 220. Each compartment 220 is to receive and retain a server 80 therein. Sidewall 222 includes a pair of panels 222a and 222b formed parallel to each other. A retaining member 230 and an actuator 240 are mounted to an external side of the sidewall 222 and between the pair of panels 222a and 222b. Server 80 is removable from the compartment 220 for maintenance and/or replacement, and inserted into the compartment 220 after the maintenance, to perform normal computing operation.

The retaining member 230 has a support portion 232, a latch 238 movably coupled to the frame 210, a link portion 234 between the support portion 232 and the latch 238, and a bearing portion 236 at an end of the retaining member 230 and connected to the latch 238. The support portion 232 is mounted to the panel 222b of sidewall 222, by e.g. a fastener or by welding. Alternatively, the retaining member 230 may be integrally formed to the sidewall 222 by e.g. stamping from a single piece of metal plate. The latch 238 is fixedly coupled to or formed integral with the support portion 232. The retaining member 230 is made of resilient material e.g. steel or alloy with elastically deformable properties. The link portion 234 is therefore elastically deformable following which the latch 238 is movable relative to the support portion 232 and the frame 210.

The panel 222a of sidewall 222 has an opening 228 formed thereon. The latch 238 is movable relative to the frame 210 between an initial position 238a and a final position 238*b*. At the initial position, the latch 238 is placed outside the compartment 220. At the final position 238*b*, the latch 238 extends into the compartment 220 through the opening 228.

The actuator 240 is movably coupled to the frame 210 and the retaining member 230. The actuator 240 is slidably coupled to the sidewall 222. The actuator 240 has an executing portion 246 positioned to face the bearing portion 236 of the retaining member 230. The actuator 240 is movable relative to the sidewall 222 between a first position 244*a* and a second position 244*b*, along a movement or actuating path 245 intersecting the link portion 234.

Figure 16:
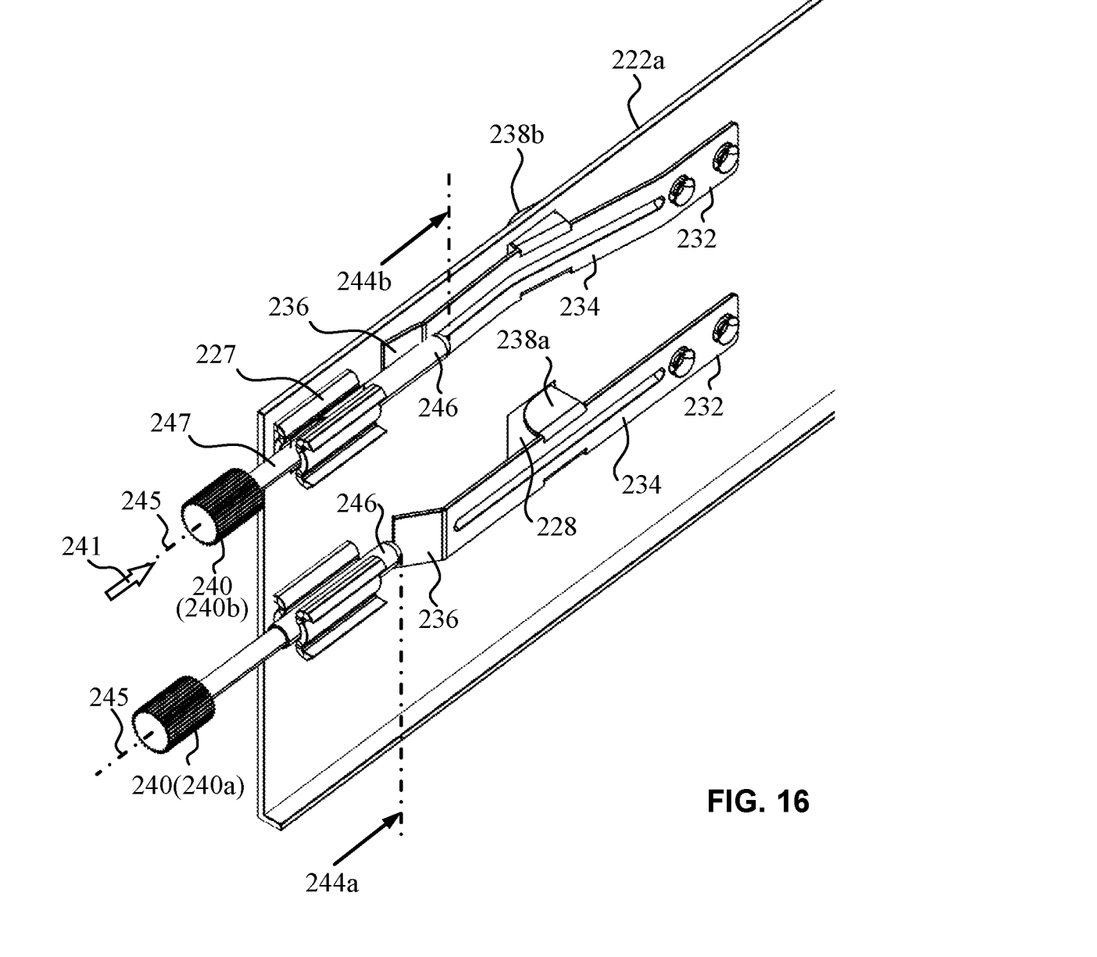
FIG. 16 is an enlarged partial perspective view of FIG. 15 showing two positions of the actuator.
Figure 17:
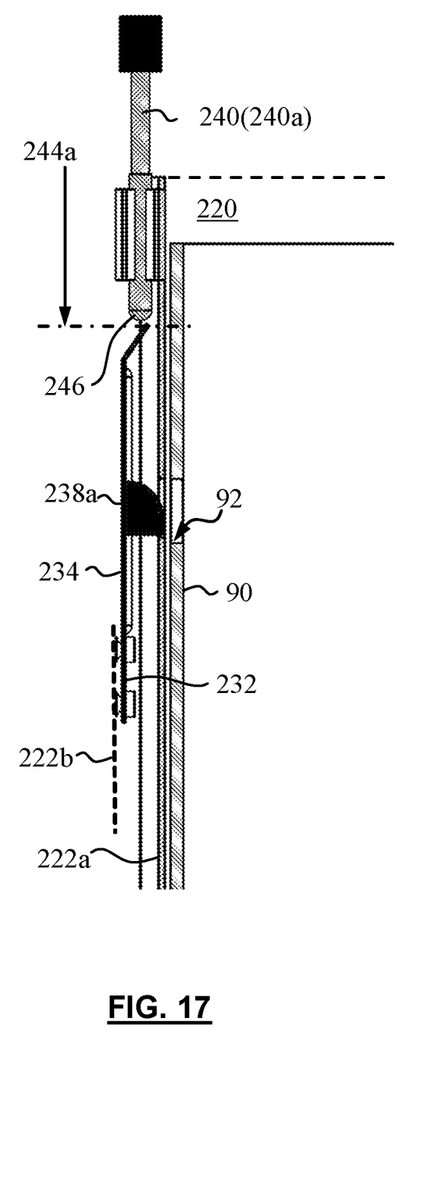
FIG. 17 is an enlarged top view of FIG. 16 showing the actuator at the first position.
Figure 18:
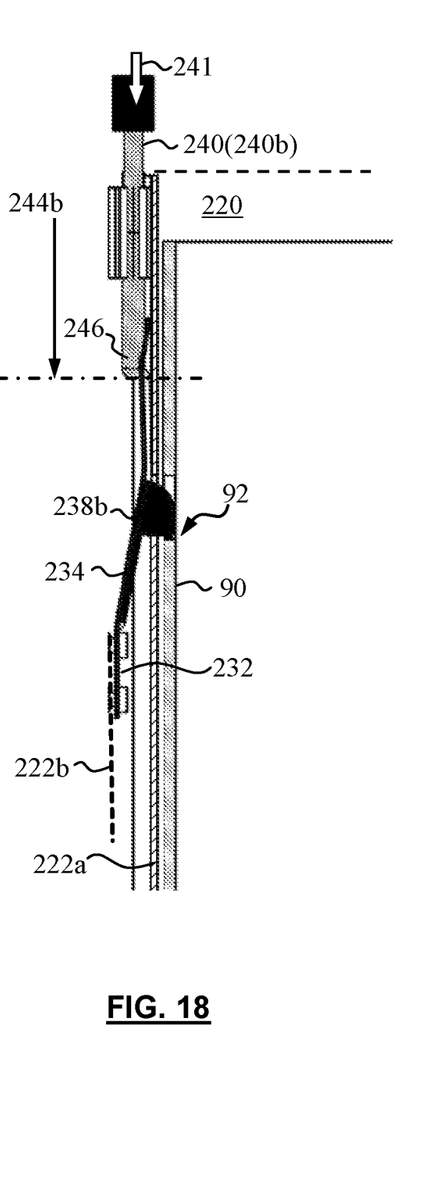
FIG. 18 is an enlarged top view of FIG. 16 showing the actuator at the second position.

Shown in FIGS. 16, 17 and 18 with further details, the actuator 240 at the first position 244*a* is depicted by reference number 240*a* and the actuator 240 at the second position 244*b* is depicted by reference number 240*b*, i.e. the actuator 240*a*, 240*b* shown in each of FIGS. 16 to 18 refer to the same actuator 240 as shown in FIGS. 12 to 15, and at respective first position 244*a* and second position 244*b*.

Upon the actuator 240 being at the first position 244*a*, as shown in e.g. FIG. 17, the actuator 240 and the retaining member 230 are disengaged from each other and accordingly, due to the resiliency of the retaining member 230, the latch 238 is biased to the initial position 238*a* at the external side of the sidewall 222, at which, the latch 238 is outside the compartment 220.

After a server 80 is inserted into the compartment 220, the actuator 240 is moved toward the retaining member 230, by e.g. a user pushing the actuator 240, to bring the executing portion 246 of the actuator 240 into engagement with the bearing portion 236 of the retaining member 230. Further advancement of the actuator 240 toward the second position 244*b*, as shown in FIG. 18, results in the executing portion 246 of the actuator 240 abutting and urging against the bearing portion 236 of the retaining member 230 and accordingly, the actuator 240 deforms the link portion 234 to move the latch 238 away from the frame 210 to the final position 238*b*, i.e. into the compartment 220 through an opening 228 formed on the panel 222*a* of the sidewall 222. By being placed in the compartment 220, the latch 238 engages the chassis 90 to lock the server 80 in the compartment 220. As shown in FIG. 16, the actuator 240 may be locked at the second position 244*b* by e.g. tightening the stem 247 to the track 227 on the panel 222*a* of the sidewall 222, to maintain the latch 238 at the final position 238*b*.

Backward movement of the actuator 240 from the second position 244*b* to the first position 244*a*, e.g. after the stem 247 is unlocked from the track 227, releases the engagement of the actuator 240 from the retaining member 230. Due to the resiliency of the retaining member 230, the biasing force of the retaining member 230 causes the latch 238 to spring back toward and return to the initial position 238*a* and retracted from the compartment 220, to release the engagement with the chassis 90 hence to unlock the server 80 from the compartment 220.

FIGS. 19 to 22 illustrate a computing system 70 according to a further embodiment of the present disclosure. The computing system 70 includes a rack 300 and one or more servers 80 removably coupled to the rack 300. The rack 300 comprises a frame 310 with one or more compartments 320 formed therein. A pair of sidewalls 322 and 324, a top plate 321 and a bottom plate 325 of the frame 310 enclose an internal space to form the compartment 320. Sidewall 322 includes a pair of panels 322*a* and 322*b* formed parallel to each other. Each compartment 320 is to receive and retain a server 80 therein and between the pair of panels 222*a* and 222*b*. A retaining member 330 and an actuator 340 are mounted to an external side of the sidewall 322. Server 80 is removable from the compartment 320 for maintenance and/or replacement, and inserted into the compartment 320 to perform normal computing operation.

Figure 19:
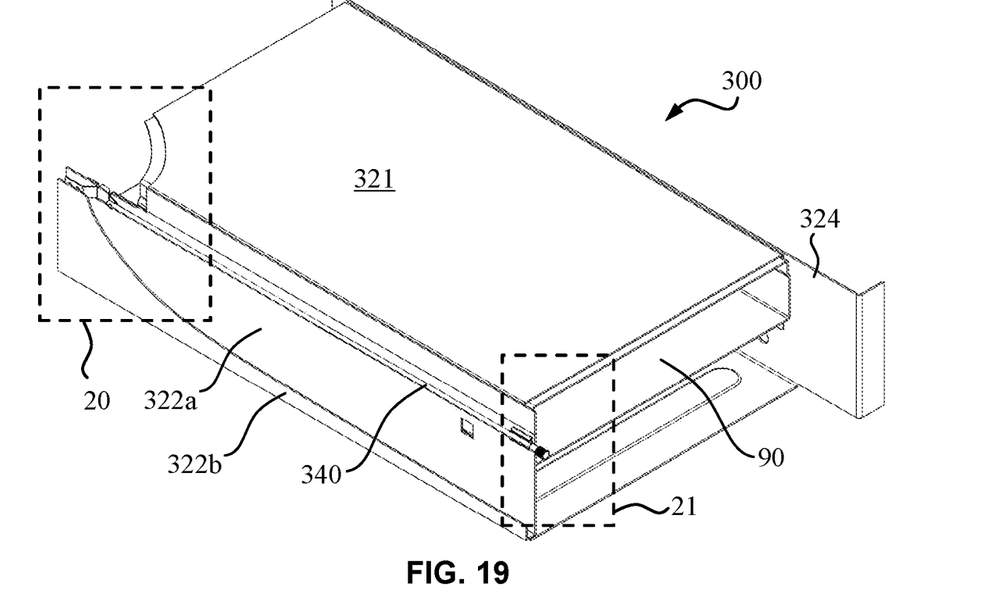
FIG. 19 is a perspective view of a computing device rack according to a further embodiment.
Figure 20:
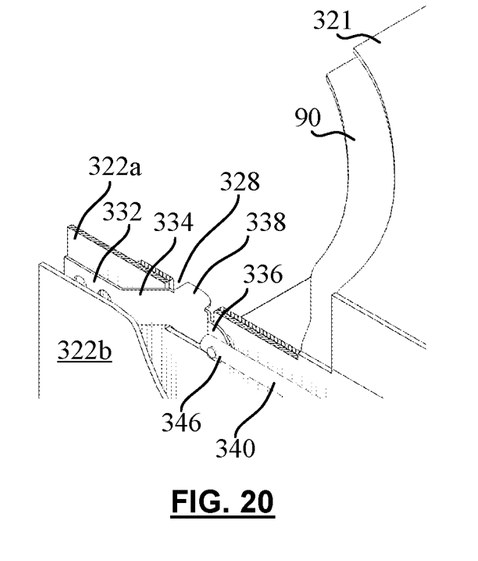
FIG. 20 is a partial enlarged view of portion 20 of FIG. 19.
Figure 21:
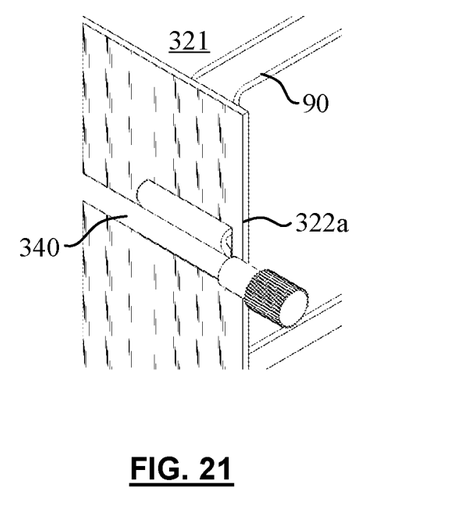
FIG. 21 is a partial enlarged view of portion 21 of FIG. 19.

The retaining member 330 has a support portion 332, a latch 338 movably coupled to the frame 310, a link portion 334 between the support portion 332 and the latch 338, and a bearing portion 336 at an end of the retaining member 330 and connected to the latch 338. The support portion 332 is mounted to the panel 322*b* of sidewall 322, by e.g. a fastener or by welding. Alternatively, the retaining member 330 may be integrally formed to the sidewall 322 by e.g. stamping from a single piece of metal plate. The latch 338 is fixedly coupled to or formed integral with the support portion 332 through the link portion 334. The retaining member 330 is made of resilient material e.g. steel or alloy with elastically deformable properties. The link portion 334 is therefore elastically deformable following which the latch 338 is movable relative to the support portion 332 and the frame 310.

The panel 322*a* of sidewall 322 has an opening 328 formed thereon. The latch 338 is movable relative to the sidewall 322 between an initial position 338*a* and a final position 338*b*. At the initial position, the latch 338 extends into the compartment 320 through the opening 328. At the final position 338*b*, the latch 338 is placed outside the compartment 320.

The actuator 340 is movably coupled to the frame 310 and the retaining member 330. The actuator 340 is slidably coupled to the sidewall 322. The actuator 340 has an executing portion 346 connected to the bearing portion 336 of the retaining member 330. The actuator 340 is movable relative to the sidewall 322 between a first position 344*a* and a second position 344*b*, along a movement or actuating path 345.

Figure 22:
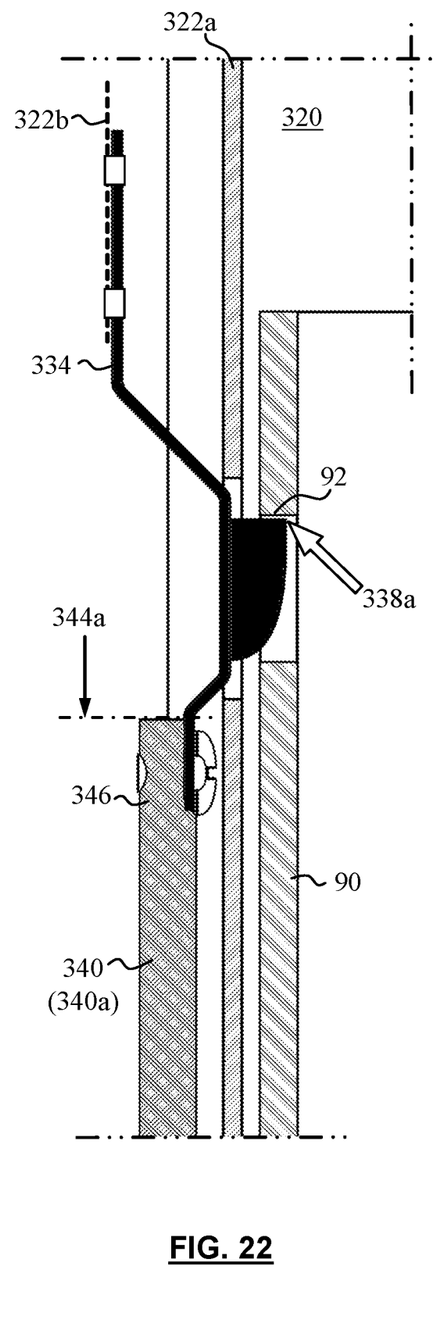
FIG. 22 is an enlarged top view of FIG. 20 showing the actuator at the first position.
Figure 23:
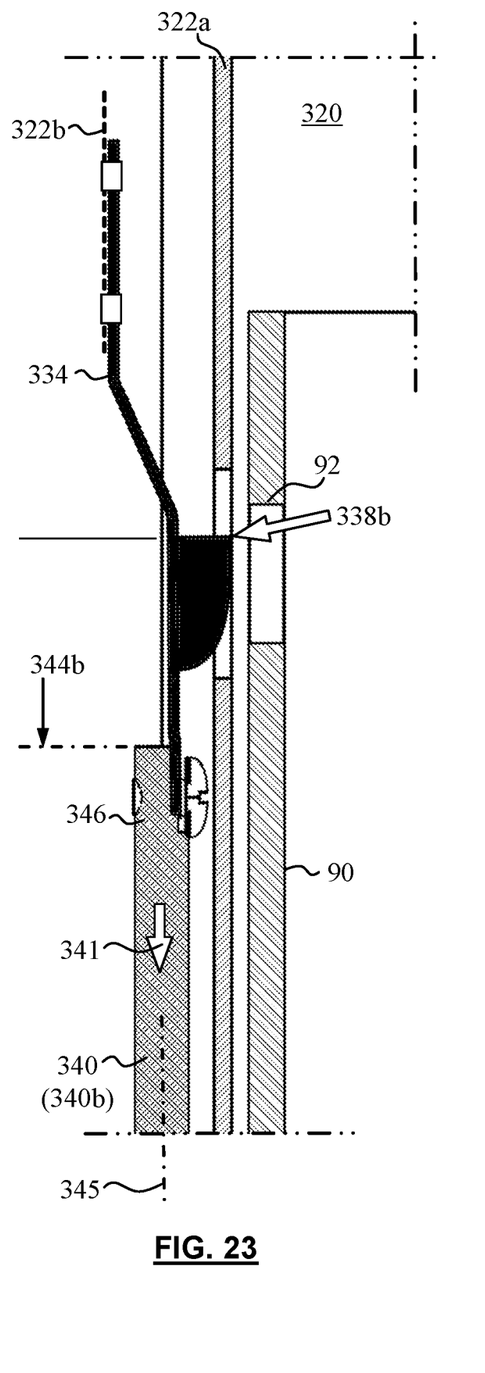
FIG. 23 is an enlarged top view of FIG. 20 showing the actuator at the second position.

Shown in FIGS. 22 and 23 with further details, the actuator 340 at the first position 344*a* is depicted by reference number 340*a* and the actuator 340 at the second position 344*b* is depicted by reference number 340*b*, i.e. the actuator 340*a*, 340*b* shown in each of FIGS. 22 and 23 refer to the same actuator 340 as shown in FIGS. 19 to 21, and at respective first position 344*a* and 344*b*.

Upon the actuator 340 being at the first position 344*a*, the latch 338 is released by the actuator 340 and acted by the resiliency of the link portion 334, to remain at the initial position 338*a*. At the initial position 338*a*, the latch 338 extends into the compartment 320 through the opening 328 of the sidewall 320, and engages a stopper 92 of the chassis 90 of server 80 placed in the compartment 320. Due to the engagement of the latch 338 to the stopper 92 of the chassis 90, the server 80 is locked in the compartment 320 i.e. removal of the server 80 from the compartment 320 is prevented by the latch 338.

In cases where the server 80 is to be removed from the compartment 320 for e.g. maintenance, the actuator 340 is pulled by a user along the actuating path 345, from the first position 344*a* as shown in FIG. 22, toward the second position 344*b* as shown in FIG. 23.

As the actuator 340 is connected to the retaining member 330 at the bearing portion 346, movement of the actuator 340 toward the second position 344*b* exerts a pulling force on the retaining member 330. As the link portion 334 is resiliently deformable, the pulling force deforms the link portion 334 following which, the latch 338 is moved out of the compartment 320 through the opening 328. After the latch 338 is moved out of the compartment 320, the chassis

90 is disengaged from the latch 338 and therefore, the server 80 can be removed from the compartment 320.

Thus, although illustrative example embodiments have been described herein with reference to the accompanying figures, it is to be understood that this description is not limiting and that various other changes and modifications may be effected therein by one skilled in the art without departing from the scope or spirit of the disclosure.

The invention claimed is:

1. A computing device rack for housing a computing device, the computing device rack comprising:
   a frame to which the computing device is mountable;
   a retaining member mounted to the frame, the retaining member having a latch that is movable relative to the frame; and
   an actuator movably coupled to the frame and the retaining member, wherein movement of the actuator relative to the frame and the retaining member from a first position to a second position deforms the retaining member to move the latch from an initial position to a final position relative to the frame, and thereby engages or disengages with the computing device that is mounted on the frame for locking or unlocking, respectively, and wherein the retaining member is resiliently deformable and biases the latch toward the initial position, and the retaining member is substantially planar.

2. The computing device rack of claim 1, wherein at the initial position the latch is disposed in a compartment of the frame to lock a chassis of a computing device received in the compartment of the frame, and at the final position the latch is disposed outside the compartment to release the chassis from the frame.

3. The computing device rack of claim 2, wherein the retaining member has a link portion between a support portion and the latch, the frame has a sidewall onto which the support portion of the retaining member is mounted, wherein the actuator has an executing portion engageable to the retaining member, and the executing portion is positioned between the sidewall and the link portion.

4. The computing device rack of claim 3, wherein the executing portion of the actuator is self-lockable to the frame upon being placed between the sidewall and the link portion.

5. The computing device rack of claim 3, wherein the sidewall has an opening formed thereon, wherein at the initial position the latch extends into the compartment through the opening.

6. The computing device rack of claim 3, wherein the actuator is movable along an actuating path parallel to the sidewall of the compartment and movement of the latch between the initial position and the final position is along a direction intersecting the actuating path.

7. The computing device rack of claim 1, wherein upon movement of the actuator from the second position to the first position, the biasing force of the retaining member causes the latch to return to the initial position.

8. The computing device rack of claim 1, wherein the actuator has an executing portion engageable to a bearing portion of the retaining member, and engagement of the actuator with the bearing portion of the retaining member moves the latch away from the frame.

9. The computing device rack of claim 1, wherein at the initial position the latch is disposed outside a compartment of the frame to unlock the computing device received in the compartment from the frame, and at the final position the latch is disposed in the compartment to lock the computing device to the frame.

10. The computing device rack of claim 1, further comprising a resilient member coupled to the frame and the actuator to urge the actuator toward the first position.

11. A computing system comprising:
    a frame;
    a computing device detachably coupled to the frame;
    a retaining member mounted to the frame, the retaining member having a latch that is movable relative to the frame; and
    an actuator moveably coupled to the frame and the retaining member, wherein movement of the actuator relative to the frame and the retaining member from a first position to a second position deforms the retaining member to move the latch from an initial position to a final position relative to the frame, and thereby engages or disengages with the computing device that is mounted on the frame for locking or unlocking, respectively, and wherein the retaining member is resiliently deformable and biases the latch toward the initial position, and the retaining member is substantially planar.

12. The computing system of claim 11, wherein at the initial position the latch is disposed in a compartment of the frame to lock the computing device received in the compartment of the frame, and at the final position the latch is disposed outside of the compartment to release the computing device from the frame.

13. The computing system of claim 12, wherein the retaining member has a link portion between a support portion and the latch, the frame has a sidewall onto which the support portion of the retaining member is mounted, wherein the actuator has an executing portion engageable to the retaining member, and the executing portion is positioned between the sidewall and the link portion.

14. The computing system of claim 11, wherein upon movement of the actuator from the second position to the first position, the biasing force of the retaining member causes the latch to return to the initial position.

15. The computing system of claim 11, wherein the computing device has a stopper formed thereon and wherein at the initial position the latch engages the stopper to lock the computing device in the compartment.

16. The computing system of claim 15, wherein the frame has a sidewall to which the retaining member is mounted and the sidewall has an opening formed thereon, wherein at the initial position the latch extends into the compartment through the opening to engage the stopper of the computing device to lock the computing device in the compartment.

17. The computing system of claim 16, wherein the actuator is movable along an actuating path parallel to the sidewall of the compartment and movement of the latch between the initial position and the final position is along a direction transversal to the sidewall of the compartment.

18. The computing system of claim 11, wherein the actuator has an executing portion engageable to a bearing portion of the retaining member, and engagement of the actuator with the bearing portion of the retaining member moves the latch away from the frame.

* * * * *